United States Patent [19]

Kohara et al.

[11] Patent Number: 4,731,319
[45] Date of Patent: Mar. 15, 1988

[54] POSITIVE-WORKING NAPHTHOQUINONE DIAZIDE PHOTORESIST COMPOSITION WITH TWO CRESOL NOVOLAC RESINS

[75] Inventors: Hidekatsu Kohara, Chigasaki; Hatsuyuki Tanaka, Samukawa; Masanori Miyabe, Sagamihara; Yoshiaki Arai, Yokohama; Shingo Asaumi, Fujisawa; Toshimasa Nakayama, Hiratsuka, all of Japan

[73] Assignee: Tokyo Ohka Kogy Co., Ltd., Kanagawa, Japan

[21] Appl. No.: 886,839

[22] Filed: Jul. 18, 1986

[30] Foreign Application Priority Data

Aug. 9, 1985 [JP] Japan .................. 60-174314

[51] Int. Cl.$^4$ .......................... G03C 1/54; G03C 1/60
[52] U.S. Cl. ................................ 430/192; 430/165; 430/193; 430/326
[58] Field of Search ................ 430/192, 193, 165

[56] References Cited

U.S. PATENT DOCUMENTS

| | | | |
|---|---|---|---|
| 4,377,631 | 3/1983 | Toukhy et al. | 430/192 |
| 4,404,357 | 9/1983 | Taylor et al. | 528/153 |
| 4,551,409 | 11/1985 | Gulla et al. | 430/192 |
| 4,587,196 | 5/1986 | Toukhy | 430/192 |

FOREIGN PATENT DOCUMENTS

| | | | |
|---|---|---|---|
| 118291 | 9/1984 | European Pat. Off. | 430/192 |
| 60-42753 | 3/1985 | Japan | 430/192 |
| 61-6647 | 1/1986 | Japan . | |

OTHER PUBLICATIONS

Pampalone, T. R., *Solid State Technology*, 6/1984, pp. 115–120.

*Primary Examiner*—Charles L. Bowers, Jr.
*Attorney, Agent, or Firm*—Hopgood, Calimafde, Kalil, Blaustein & Judlowe

[57] ABSTRACT

A positive-working photoresist composition suitable for fine patterning in the manufacture of semiconductor devices, e.g. VLSIs, with high fidelity is proposed. The composition comprises a cresol novolac resin and a naphthoquinone diazide sulfonic acid ester as the photosensitive component while the cresol novolac resin component is characteristically a combination of two different cresol novolac resins differentiated in respects of the weight-average molecular weight, one large and the other small, and the weight proportion of the m- and p-isomers of cresol, one rich in the m-isomer and the other rich in the p-isomer, used in the preparation of the novolac and the overall weight ratio of the m-cresol and p-cresol moieties in the thus combined cresol novolac resins also should be in a specified range.

2 Claims, 3 Drawing Figures

POSITIVE-WORKING NAPHTHOQUINONE DIAZIDE PHOTORESIST COMPOSITION WITH TWO CRESOL NOVOLAC RESINS

BACKGROUND OF THE INVENTION

The present invention relates to a positive-working photoresist composition or, more particularly, to a positive-working photoresist composition suitable for use in fine patterning of a photoresist layer in the manufacturing process of semiconductor-based devices such as integrated circuits.

Recent progress in the semiconductor technology day by day has aroused a rapidly increasing demand for computerized instruments including computers for industrial use, instruments for automatization of offices, personal computers and the like and, corresponding thereto, semiconductor devices such as integrated circuits are under an overwhelming trend toward increase in the density or degree of integration. For example, the times are already entering the era of VLSIs having a density of 1 megabit or higher after passing through the ages of 256 kilobits. Such a high density of integration in VLSIs naturally requires extremely fine patterning on semiconductor wafers in the so-called submicron range. For example, the minimum line width to be reproduced with high fidelity in the photoresist layer is about 2 $\mu$m in 256 kilobits DRAMs, about 1.0 to 1.3 $\mu$m in 1 megabit DRAMs and about 0.7 to 0.8 $\mu$m in 4 megabits DRAMs.

As is known, the patterning works on the semiconductor wafers for the manufacture of integrated circuits are performed by the technology of photolithography using a photoresist composition. Of the two types of photoresist compositions including positive-working and negative-working ones, the positive-working photoresist compositions are preferred widely in the works of fine patterning in which high-fidelity reproduction of a line pattern having a width of 1 to 2 $\mu$m is essential.

The principal ingredients in most of the conventional positive-working photoresist compositions are an alkali-soluble novolac resin as the film-forming constituent and a quinone diazide compound as the photodecomposable or photosensitive constituent in the form of a mixture or a condensation product of both. Since the sensitivity, resolving power, etc. in the patterning work heavily depend on the kinds and proportion of these two constituents and the manner of combining them in the photoresist composition as well as on the procedure of development after exposure to light, various attempts and proposals have been made hitherto in respect of manufacturing of the photoresist compositions and the way of using the photoresist composition in the photolithography. For example, Japanese Patent Kokai No. 58-17112 teaches that the sensitivity of a positive-working photoresist composition comprising a cresol novolac resin as the film-forming constituent can be improved by suitably selecting the proportion of the cresol isomers in the cresol used in the preparation of the cresol novolac resin.

Turning now to the problems in the process of exposure of the photoresist layer to light, the exposure is carried out either by the exposure by direct contacting or by the exposure by minifying projection. In the former method of contacting exposure, the photoresist layer formed on the surface of a semiconductor wafer is exposed to light through a patterned photomask in direct contact with the photoresist layer. This method is advantageous in respect of the contrast of the patterned image so that a patterned photoresist layer of a considerably high contrast can be obtained by this method even when the photoresist composition used there is inherently inferior in respect of the contrast and fidelity of the pattern reproduction. On the contrary to the advantages, this method has some disadvantages and problems. For example, the photomask is sometimes damaged mechanically as a natural consequence of direct contact with the photoresist layer in each time of exposure so that extreme care is required in handling the photomask and good quality of the photomasks can be maintained only with expenses more than negligible. Moreover, needless to say, the pattern on the photomask must be of the full-size relative to the pattern to be reproduced so that a patterned photomask having such a high precision is unavoidably very expensive, especially, when the line width of the pattern is in the submicron range.

In the method of exposure by minifying projection, on the other hand, the dimension of the pattern on a patterned photomask can be as large as 5 to 10 times of that in the photoresist pattern to be reproduced so that even a photomask of high precision for patterning in the submicron range can be obtained with a relatively low cost. On the contrary to this advantage, this method is disadvantageous in respect of the contrast of light between the areas to be exposed and not to be exposed in comparison with the exposure by direct contacting of the photomasks. Therefore, this method of exposure by minifying projection is applicable to the reproduction of a pattern of high precision only when the photoresist composition is inherently suitable for exposure with high contrast or high fidelity.

In the manufacture of semiconductor devices such as VLSIs, furthermore, the pattern to be formed in the photoresist layer is not composed of lines having one and the same line width but includes lines having varied line widths combined in a complicated manner. This fact causes a difficult problem affecting the quality of pattern reproduction since the optimum exposure dose to a photoresist layer considerably depends on the line width. Taking the optimum exposure dose to a pattern of 2.0 $\mu$m line width as unity, for example, the optimum exposure doses to patterns of 1.5 $\mu$m and 1.0 $\mu$m line widths are 1.2 to 1.3 and 1.5 to 1.7, respectively. Therefore, an exposure dose which may be optimum for a line of 1.0 $\mu$m line width is excessively large for lines having line widths of 1.5 and 2.0 $\mu$m in the same pattern so that the fidelity of pattern reproduction cannot be highest over whole area of the pattern. Moreover, the surface of a semiconductor device under way of processing is not completely flat but usually has a stepwise height difference of 0.5 to 1.0 $\mu$m from portion to portion so that the thickness of a photoresist layer formed on such a stepwise surface cannot be uniform to be smaller in the upside area of the step and larger in the downside area of the step. When such a photoresist layer is exposed to light and developed, therefore, it is usual that the line width of the pattern reproduced in the photoresist layer is smaller in the area where the photoresist layer has a smaller thickness than in the area where the thickness is larger affecting the fidelity of pattern reproduction.

In connection with the process of etching on the surface of a semiconductor wafer on which a patterned photoresist layer is formed, an undesirable phenomenon of side etching is unavoidable more or less in a wet process so that the process of etching is sometimes performed by a dry process free from side etching by use of plasma. In this dry etching method, however, the patterned photoresist layer as the etching mask is attacked by the plasma to cause gradual reduction in the film thickness. Accordingly, it is a desirable condition that the patterned line of the photoresist layer has a cross section in which the width of the line is not affected even when the film thickness is reduced by the attack of the plasma in the process of dry etching.

The above described problems each concern the poor reproducibility or fidelity between the original of the pattern on the photomask and the patterned image reproduced in the photoresist layer. The reasons therefor include, as is mentioned above, the decrease in the contrast in the exposure by minifying projection between the exposed and unexposed areas, difference in the optimum exposure doses between line patterns having different line widths, difference in the film thickness of the photoresist layer between the areas on both sides of a step on the wafer surface having stepwise height differences, and so on.

These problems can be solved as a whole only by the use of a photoresist composition having high fidelity in pattern reproduction and free from the influence of the exposure dose on the dimensions of the reproduced pattern. The photoresist composition free from the influence of the exposure dose on the dimensions of the reproduced pattern here implied should have following characteristics. Namely, the reproduced line pattern should have a line width which is an accurate reproduction of the line on the original pattern of the photomask without expansion or diminishment irrespective of the exposure dose or the extent of development. The patterned line of the photoresist layer should have a rectangular cross section standing on the substrate surface with definitely angled shoulders while undesirable cross sectional configurations include those having rounded shoulders or having trailing skirts on the substrate surface even with definitely angled shoulders.

SUMMARY OF THE INVENTION

An object of the present invention is therefore to provide a positive-working photoresist composition free from the above described problems capable of giving a patterned photoresist layer which is an accurate reproduction of the original pattern with high fidelity and unaffected by the influence of the exposure dose on the width of the patterned lines.

Thus, the positive-working photoresist composition provided by the invention comprises:
(A) 100 parts by weight of a cresol novolac resin as a film-forming constituent; and
(B) from 25 to 60 parts by weight of a naphthoquinone diazide sulfonic acid ester as a photosensitive constituent, the cresol novolac resin being a combination composed of:
(A-1) a first cresol novolac resin having a weight-average molecular weight of at least 5000 and produced from an isomeric mixture composed of 60 to 80% of m-cresol and 40 to 20% of p-cresol; and
(A-2) a second cresol novolac resin having a weight-average molecular weight not exceeding 5000 and produced from an isomeric mixture composed of 10 to 40% of m-cresol and 90 to 60% of p-cresol, in such a proportion that the overall cresol moiety in the component (A) is composed of from 30 to 46.5% of the m-cresol moiety and from 70 to 53.5% of the p-cresol moiety.

DETAILED DESCRIPTION OF THE PREFERRED EMBODIMENTS

Figure 1:
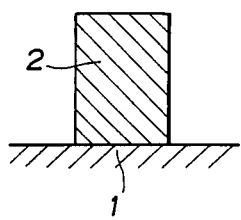
FIGS. 1, 2 and 3 each schematically illustrate a cross section of a patterned line of the photoresist layer produced in Examples.

As is understood from the above given summarizing description, the most characteristic feature of the inventive photoresist composition consists in the specific cresol novolac resin as the film-forming constituent which is a combination in a specified proportion of two different cresol novolac resins differentiated in respects of the weight-average molecular weight and the mixing ratio of the m- and p-isomers of cresol used as the starting material for the preparation of the respective cresol novolac resins.

The discoveries leading to the establishment of the present invention having the above mentioned unique characteristic include that, in a cresol novolac resin prepared from an isomeric mixture composed of 60 to 80% of m-cresol and 40 to 20% of p-cresol, the cresol moiety in the oligomeric fraction or in the unreacted cresol is mainly p-cresol, that the oligomeric, e.g. dimeric, trimeric, etc. of fraction of the cresol novolac resin rich in the p-cresol moiety may act as a dissolution retarder in a photoresist layer formulated with the cresol novolac resin and that, therefore, substantial improvements of a photoresist composition can be achieved when the film-forming constituent therein is a combination in a specific proportion of a first cresol novolac resin of a relatively high molecular weight and rich in the m-cresol moiety and a second cresol novolac resin of a relatively low molecular weight and rich in the p-cresol moiety.

The naphthoquinone diazide sulfonic acid ester, i.e. component (B), as the photosensitive ingredient in the inventive photoresist composition is a reaction product obtained by the esterification reaction of a naphthoquinone diazide sulfonic acid and a phenolic compound such as polyhydroxy benzophenones, alkyl gallates and the like and the reaction of esterification can be performed readily according to a conventional procedure.

The phenolic compound as one of the reactants in the esterification reaction is exemplified, in addition to the above mentioned polyhydroxy benzophenones, e.g. tetrahydroxy benzophenone, and alkyl gallates, by trihydroxybenzenes, trihydroxybenzene monoethers, 2,2',4,4'-tetrahydroxy diphenyl methane, 4,4'-dihydroxy diphenyl propane, 4,4'-dihydroxy diphenyl sulfone, 2,2'-dihydroxy-1,1'-dinaphthyl methane, 2-hydroxyfluorene, 2-hydroxyphenanthrene, polyhydroxy anthraquinones, purpurogallin and derivatives thereof, phenyl 2,4,6-trihydroxybenzoate and the like.

The cresol novolac resin, i.e. component (A), as the film-forming constituent in the inventive photoresist composition is, as is mentioned above, a binary combination in a specified proportion of two different cresol novolac resins defined as (A-1) and (A-2) in terms of the weight-average molecular weight and the isomeric mixing ratio of cresol isomers in the starting cresol used in the preparation of the respective cresol novolac resins. When these requirements relative to the weight-average molecular weight and the isomeric proportion of the cresol in each of the two cresol novolac resins as well as the proportion of the two cresol novolac resins are not satisfied, the desired improvement in the photoresist composition cannot be fully achieved.

The inventive photoresist composition should comprise from 25 to 60 parts by weight of the naphthoquinone diazide sulfonic acid ester as the photosensitive constituent per 100 parts by weight of the cresol novolac resin as the film-forming constituent. When the amount of the photosensitive constituent is in excess of 60 parts by weight, the photoresist composition would have a remarkably decreased sensitivity while, when the amount thereof is too small, an adverse effect is caused on the cross sectional configuration of the line in the patterned photoresist layer.

The inventive positive-working photoresist composition is used usually in the form of a solution prepared by dissolving the above described cresol novolac resin and the naphthoquinone diazide sulfonic acid ester in a suitable organic solvent. Exemplary of the organic solvent used in this case are ketones, e.g. acetone, methyl ethyl ketone, cyclohexanone and isoamyl ketone, polyhydric alcohols and derivatives thereof, e.g. ethylene glycol, ethylele glycol monoacetate, diethylene glycol and monomethyl, monoethyl, monopropyl, monobutyl and monophenyl ethers of diethylene glycol monoacetate; cyclic ethers, e.g. dioxane; and esters, e.g. methyl acetate, ethyl acetate and butyl acetate. These organic solvents can be used either singly or as a mixture of two kinds or more according to need.

The inventive positive-working photoresist composition may be admixed optionally with various kinds of known additives having compatibility with the essential ingredients and conventionally used in photoresist compositions such as auxiliary resins, plasticizers, stabilizers, coloring agents to serve for further increasing the visibility of the patterned image after development and so on.

The procedure for forming a patterned photoresist layer using the inventive photoresist composition may be conventional. For example, the surface of a substrate body such as a semiconductor silicon wafer is coated with the inventive photoresist composition in the form of an organic solution by use of a suitable coating machine such as spinners followed by drying to form a uniform photoresist layer thereon, which is then exposed to light on a minifying projector or a suitable apparatus for exposure through a photomask bearing a desired pattern followed by development using a developing solution such as an aqueous solution of an organic base, e.g. tetramethyl ammonium hydroxide, in a concentration of 2 to 5% by weight so that the photoresist layer is selectively dissolved away on the areas where the photoresist composition has been imparted with increased solubility in the developing solution as a result of exposure to light to give a high-fidelity minified reproduction of the pattern on the photomask. Advantageously, the thus reproduced pattern is a very accurate reproduction of the photomask pattern to the utmost fineness having a line width in the submicron range with dimensional accuracy and the dimensional accuracy is not affected even on a substrate surface having stepwise height differences in the exposure by minifying projection which may give poor contrast as a trend. Accordingly, the inventive positive-working photoresist composition can be used advantageously in the manufacture of high-precision semiconductor devices such as VLSIs.

In the following, the positive-working photoresist composition of the invention is illustrated in more detail by way of examples and comparative examples.

EXAMPLE 1

A cresol novolac resin, referred to as the resin I hereinbelow, was prepared according to a conventional procedure by the condensation reaction in a reaction mixture composed of 60:40 by weight mixture of m- and p-cresols and formalin in the presence of oxalic acid as the catalyst. The cresol novolac resin had a weight-average molecular weight of about 28,000 as determined with reference to standard polystyrenes. Separately, another cresol novolac resin, referred to as the resin II hereinbelow, having a weight-average molecular weight of 2000 was prepared in the same manner from 40:60 by weight mixture of m- and p-cresols.

A positive-working photoresist composition in the form of a solution was prepared by dissolving 30 parts by weight of the resin I, 70 parts by weight of the resin II and 30 parts by weight of a reaction product of 2,3,4-trihydroxy benzophenone and naphthoquinone-1,2-diazide-5-sulfonic chloride in a molar ratio of 1:1.6 in 390 parts by weight of ethylene glycol monoethyl ether acetate followed by filtration through a membrane filter having pores of 0.2 μm diameter.

A silicon wafer of 3 inch diameter was uniformly coated with the photoresist solution in a coating thickness of 1.3 μm as dried using a resist coater (Model TR-4000, manufactured by Tazmo Co.) followed by drying and pre-baking for 90 seconds on a hot plate kept at 110° C. to give a photoresist layer on the wafer. The silicon wafer provided with the photoresist coating layer was then exposed to ultraviolet light on a minifying projector (Wafer Stepper Model DSW-4800, manufactured by GCA Co.) through a test chart photomask manufactured by Dai-Nippon Printing Co. and developed for 30 seconds at 23° C. using a 2.38% by weight aqueous solution of tetramethyl ammonium hydroxide as the developing solution.

The patterned lines of the photoresist layer thus developed had an ideally rectangular cross section as is schematically illustrated in FIG. 1 of the accompanying drawing.

EXAMPLES 2 TO 8 AND COMPARATIVE EXAMPLES 1 TO 5

The experimental procedure was substantially the same as in Example 1 except that the m-cresol-rich cresol novolac resin, referred to as the resin I hereinbelow, and the p-cresol-rich cresol novolac resin, referred to as the resin II hereinbelow, used in each of the experiments were each prepared from an isomeric mixture of m-and p-cresols in a proportion shown in Table 1 below as the m:p ratio and had a weight-average molecular weight also shown in the table as $\overline{M}_w$, that the resins I and II were taken each in an amount shown in the table by parts by weight to give a weight ratio of the m-cresol moiety to the p-cresol moiety in the combined cresol novolac resins shown in the table as the overall m:p ratio and that different photosensitive compounds were used in varied amounts as indicated in the table. In Table 1, the photosensitizer components are indicated by the symbols respectively indicating the following compounds.

TR: 2,3,4-Trihydroxybenzophenone naphthoquinone-1,2-diazido-5-sulfonic acid ester TE: 2,3,4,4'-Tetrahydroxybenzophenone naphthoquinone-1,2-diazido-5-sulfonic acid ester GP: Propyl gallate naphthoquinone-1,2-diazido-5-sulfonic acid GA: Isoamyl gallate naphthoquinone-1,2-diazido-5-sulfonic acid Further, the ratio of OH:AZ given in the table is defined by the molar ratio of the phenolic compound and the naphthoquinone diazide compound taken as the starting materials in the esterification reaction for the preparation of the respective photosensitive compounds.

Figure 2:
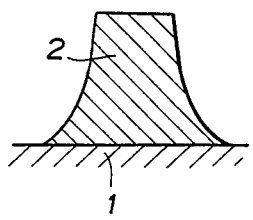
Figure 3:
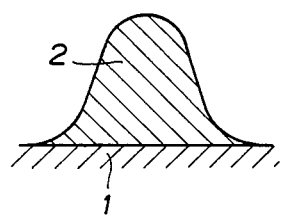

The results of these tests indicated by the numerals 1, 2 and 3 in the table were evaluated with reference to FIGS. 1 to 3 by the cross sectional configuration of the lines 2 of the patterned photoresist layers after development on the substrate 1, which may be rectangular as is illustrated in FIG. 1, plateau-like with definitely angled shoulders but with trailing skirts as is illustrated in FIG. 2 or broad with rounded shoulders and trailing skirts as is illustrated in FIG. 3, respectively.

TABLE 1

|  |  | Example | | | | | | | Comparative Example | | | | |
| --- | --- | --- | --- | --- | --- | --- | --- | --- | --- | --- | --- | --- | --- |
|  |  | 2 | 3 | 4 | 5 | 6 | 7 | 8 | 1 | 2 | 3 | 4 | 5 |
| Resin I | $\overline{M_w}, \times 10^3$ | 32 | 20 | 15 | 28 | 32 | 32 | 32 | 32 | 30 | — | 28 | 32 |
|  | m:p ratio | 60:40 | 70:30 | 80:20 | 60:40 | 60:40 | 60:40 | 60:40 | 60:40 | 70:30 | — | 60:40 | 60:40 |
|  | Parts by wt. | 30 | 30 | 20 | 50 | 60 | 60 | 60 | 100 | 100 | — | 100 | 60 |
| Resin II | $\overline{M_w}, \times 10^3$ | 1 | 1.5 | 2.5 | 3 | 1.5 | 1.5 | 1.5 | — | — | 2 | — | 1.5 |
|  | m:p ratio | 30:70 | 20:80 | 30:70 | 30:70 | 20:80 | 20:80 | 20:80 | — | — | 50:50 | — | 60:40 |
|  | Parts by wt. | 70 | 70 | 80 | 50 | 40 | 40 | 40 | — | — | 100 | — | 40 |
| Overall m:p ratio |  | 39:61 | 35:65 | 40:60 | 45:55 | 44:56 | 44:56 | 44:56 | 60:40 | 70:30 | 50:50 | 60:40 | 60:40 |
| Photosensitizer | Compound | TR | TR | GP | TE | TR | TR | TR | TR | TR | TR | GA | TR |
|  | OH:AZ ratio | 1:1.6 | 1:1.6 | 1:1.8 | 1:2.3 | 1:1.8 | 1:1.6 | 1:1.6 | 1:1.6 | 1:1.8 | 1:1.8 | 1:1.8 | 1:1.6 |
|  | Parts by wt. | 30 | 30 | 27 | 30 | 25 | 40 | 50 | 30 | 25 | 30 | 25 | 30 |
| Exposure time, milliseconds |  | 960 | 1050 | 800 | 500 | 500 | 900 | 1000 | 450 | 400 | 350 | 550 | 300 |
| Cross section of patterned line |  | 1 | 1 | 1 | 1 | 1 | 1 | 1 | 2 | 3 | 3 | 3 | 3 |

EXAMPLE 9

The experimental procedure was substantially the same as in Example 1 except that the test chart photomask was replaced with a test chart reticle having line-and-space patterns of 1.25 μm and 2.0 μm widths. The results were that the pattern of the photoresist layer produced on the silicon wafer was an accurate reproduction of the pattern on the test chart reticle with high fidelity.

COMPARATIVE EXAMPLE 6

The experimental procedure was substantially the same as in Comparative Example 1 except that the test chart photomask was replaced with the same test chart reticle as used in Example 9 and the length of the exposure time was 450 milliseconds. The results were that the line-and-space pattern of 1.25 μm width could be reproduced on the silicon wafer while the line-and-space pattern of 2.0 μm width was reproduced incompletely as composed of a line pattern of 1.6 μm width and a space pattern of 2.4 μm width.

What is claimed is:

1. A positive-working photoresist composition which comprises an admixture of:
   (A) 100 parts by weight of a cresol novolac resin as a film-forming constituent; and
   (B) from 25 to 60 parts by weight of a naphthoquinone diazide sulfonic acid ester as a photosensitive constituent, the cresol novolac resin being a combination composed of:
      (A-1) a first cresol novolac resin having a weight-average molecular weight of at least 5000 and produced from an isomeric mixture consisting essentially of 60 to 80% of m-cresol and 40 to 20% of p-cresol; and
      (A-2) a second cresol novolac resin having a weight-average molecular weight not exceeding 5000 and produced from an isometric mixture consisting essentially of 10 to 40% of m-cresol and 90 to 60% of p-cresol
   in such a proportion that the overall cresol moiety in the component (A) is comprised of from 30 to 46.5% of the m-cresol moiety and from 70 to 53.5% of the p-cresol moiety.

2. The positive-working photoresist composition as claimed in claim 1 wherein the naphthoquinone diazide sulfonic acid ester is an esterification product of naphthoquinone-1,2-diazido-5-sulfonic acid and a polyhydroxy benzophenone or an alkyl gallate.

* * * * *